(12) United States Patent
Jiang et al.

(10) Patent No.: US 12,003,023 B2
(45) Date of Patent: Jun. 4, 2024

(54) IN-PACKAGE 3D ANTENNA

(71) Applicant: INTEL CORPORATION, Santa Clara, CA (US)

(72) Inventors: Zhenguo Jiang, Chandler, AZ (US); Omkar Karhade, Chandler, AZ (US); Srichaitra Chavali, Chandler, AZ (US); Zhichao Zhang, Chandler, AZ (US); Jimin Yao, Chandler, AZ (US); Stephen Smith, Laveen, AZ (US); Xiaoqian Li, Chandler, AZ (US); Robert Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1034 days.

(21) Appl. No.: 16/258,573

(22) Filed: Jan. 26, 2019

(65) Prior Publication Data

US 2020/0243956 A1    Jul. 30, 2020

(51) Int. Cl.
*H01Q 1/22* (2006.01)
*H01L 21/56* (2006.01)
*H01L 23/00* (2006.01)
*H01Q 1/38* (2006.01)

(52) U.S. Cl.
CPC ............... *H01Q 1/38* (2013.01); *H01L 21/56* (2013.01); *H01L 24/26* (2013.01); *H01Q 1/2283* (2013.01); *H05K 2201/10098* (2013.01)

(58) Field of Classification Search
CPC .......... H01Q 1/38; H01Q 1/2283; H01Q 9/40; H01L 21/56; H01L 24/26; H01L 24/16; H01L 23/66; H01L 25/0655; H01L 2223/6677; H01L 2224/131; H01L 2224/16227; H01L 2224/16235; H01L 2924/15311; H01L 2924/19107; H01L 2924/3025; H05K 2201/10098
See application file for complete search history.

(56) References Cited

U.S. PATENT DOCUMENTS

| | | | | |
|---|---|---|---|---|
| 10,483,640 | B1 * | 11/2019 | Issa ........................... | H01Q 5/25 |
| 2005/0140557 | A1 * | 6/2005 | Kuroda ................... | H01Q 19/09 |
| | | | | 343/773 |
| 2005/0264462 | A1 * | 12/2005 | Yanagi ..................... | H01Q 9/40 |
| | | | | 343/773 |
| 2006/0043585 | A1 * | 3/2006 | Sukegawa ............... | H01L 23/66 |
| | | | | 257/737 |

(Continued)

*Primary Examiner* — Awat M Salih
(74) *Attorney, Agent, or Firm* — Schwabe, Williamson & Wyatt, P.C.

(57) ABSTRACT

An RF chip package comprises a housing and one or more conductive contacts designed to electrically connect the RF chip package to other conductive contacts. The housing includes a first substrate, a 3-D antenna on the first substrate, and a second substrate. The second substrate includes a plurality of semiconductor devices and is bonded to the first substrate. An interconnect structure allows for electrical connection between the first and second substrates. In some cases, the first substrate is flip-chip bonded to the second substrate or is otherwise connected to the second substrate by an array of solder balls. By integrating both the 3-D antenna and RF circuitry together in the same chip package, costs are minimized while bandwidth is greatly improved compared to a separately machined 3-D antenna.

10 Claims, 17 Drawing Sheets

(56) References Cited

U.S. PATENT DOCUMENTS

| | | | |
|---|---|---|---|
| 2006/0187134 A1* | 8/2006 | Hoshi | H01Q 9/40 343/773 |
| 2006/0284779 A1* | 12/2006 | Parsche | H01Q 21/29 343/773 |
| 2009/0243079 A1* | 10/2009 | Lim | H01L 23/5382 257/691 |
| 2011/0063182 A1* | 3/2011 | Sanford | H01Q 9/0407 29/601 |
| 2011/0170268 A1* | 7/2011 | Takemura | H01L 23/552 174/250 |
| 2018/0166405 A1* | 6/2018 | Chiang | H01L 24/73 |
| 2019/0088603 A1* | 3/2019 | Marimuthu | H01L 23/528 |

* cited by examiner

IN-PACKAGE 3D ANTENNA

BACKGROUND

Wireless communication devices, such as handheld computing devices and wireless access points, include antennas. The frequencies over which communication may occur may depend on the shape and arrangement of an antenna or antenna array, among other factors. There are a number of non-trivial issues associated with antennas and how they are physically incorporated within wireless communication devices.

BRIEF DESCRIPTION OF THE DRAWINGS

Features and advantages of embodiments of the claimed subject matter will become apparent as the following Detailed Description proceeds, and upon reference to the Drawings, in which:

Figure 1A:
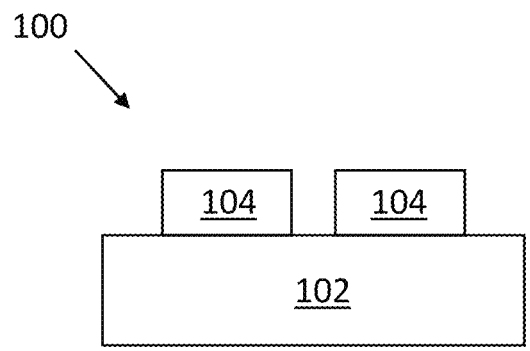
FIG. 1A illustrates one or more integrated circuit chips bonded to an antenna board, in accordance with an embodiment of the present disclosure.

Although the following Detailed Description will proceed with reference being made to illustrative embodiments, many alternatives, modifications, and variations thereof will be apparent in light of this disclosure.

DETAILED DESCRIPTION

As noted above, there are a number of non-trivial issues associated with antenna design. For instance, due to manufacturing challenges, antennas used within a chip package have been limited to planar structures. But planar antenna designs have limited bandwidth and may not radiate at the frequency band of interest due to constraints of planar fabrication. 3-D antenna structures have been manufactured or machined separately, and then connected to given chip packages. But using 3-D antennas in this way is not feasible for many applications, such as mmWave applications, largely due to form factor as well as cost restrictions to some extent. Thus, techniques and designs are provided herein that allow for integration of 3-D antennas into a same chip package with radio frequency (RF) circuitry, or other integrated circuit applications that can benefit from co-integration of one or more 3-D antenna structures and related integrated circuitry.

In an embodiment, an RF chip package comprises a housing and one or more conductive contacts designed to electrically connect the RF chip package to other conductive contacts. The housing includes a first substrate, a 3-D antenna on the first substrate, and a second substrate. The second substrate includes a plurality of semiconductor devices and is bonded to the first substrate. By integrating both the 3-D antenna and RF circuitry together in the same chip package, costs are minimized while bandwidth is greatly improved compared to a separately machined 3-D antenna. Furthermore, example embodiments herein describe 3-D antenna manufacturing methods that allow for integrated antenna feeding structures to be fabricated using standard package technologies.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 5" may be used to refer to the collection of drawings of FIGS. 5A-5D, the phrase "FIG. 7" may be used to refer to the collection of drawings of FIGS. 7A-7D, etc.

3-D Antenna Integration Overview

FIG. 1A illustrates an RF module 100 that includes an antenna board 102 having one or more RF integrated circuits (RFIC) 104 bonded to it, according to an embodiment. RFICs 104 can be bonded to antenna board 102 using any known flip-chip bonding technique. For example, RFICs 104 are bonded to antenna board 102 using a ball grid array (BGA) or a controlled collapse chip connection (C4). In other examples, RFICs 104 are bonded to antenna board 102 using wire bonding.

Antenna board 102 may be fabricated using printed circuit board (PCB) technology, and may include between two and eight PCB layers. In some other embodiments, antenna board 102 includes one or more dielectric layers (e.g., laminated layers) with a total thickness between about 0.5 mm and about 1.5 mm. In some embodiments, the dielectric material of the one or more dielectric layers includes an organic dielectric material, a fire-retardant grade 4 material (FR-4), bismaleimide triazine (BT) resin, polyimide materials, glass reinforced epoxy matrix materials, high-k dielectric, low-k or ultra low-k dielectric (e.g., carbon-doped dielectrics, fluorine-doped dielectrics, porous dielectrics, and organic polymeric dielectrics).

Antenna board 102 may include one or more 3-D antennas. Each of the 3-D antennas may be different sizes for operation at different frequency bands, or they may each be the same size. In some embodiments, the one or more 3-D antennas of antenna board 102 support multiple communication bands (e.g., dual band operation or tri-band operation). For example, some of the antennas may support tri-band operation at 28 gigahertz, 39 gigahertz, and 60 gigahertz. Various ones of the antennas may support tri-band operation at 24.5 gigahertz to 29 gigahertz, 37 gigahertz to 43 gigahertz, and 57 gigahertz to 71 gigahertz. Various ones of the antennas may support 5G communications and 60 gigahertz communications. Various ones of the antennas may support 28 gigahertz and 39 gigahertz communications. Various ones of the antennas may support millimeter wave communications. Various ones of the antennas may support high band frequencies and low band frequencies. Various embodiments for fabricating such 3-D antennas are disclosed herein with reference to FIGS. 4-11. Antenna board 102 may also include any number of semiconductor devices and/or integrated circuits in addition to one or more antenna structures.

RFICs 104 include any number of semiconductor devices and/or circuits configured to at least one of filter, amplify, or modulate (or demodulate, as the case may be) in any way RF signals. RFICs 104 may also include digital-to-analog or analog-to-digital converters to convert RF signals to digital signals and vice-versa. Accordingly, RFICs 104 include any number of resistors, capacitors (e.g., decoupling capacitors), inductors, DC-DC converter circuitry, or other circuit elements. In some embodiments, RFICs 104 include a memory device programmed with instructions to execute beam forming, scanning, and/or codebook functions. In such situations where RFICs 104 can execute beam forming, the 3-D antennas of antenna board 102 may be arranged in a beam steering array. As will be appreciated, RFICs 104 may each be configured separately as a transmitter, receiver, or transceiver, using standard or proprietary technology.

Figure 1B:
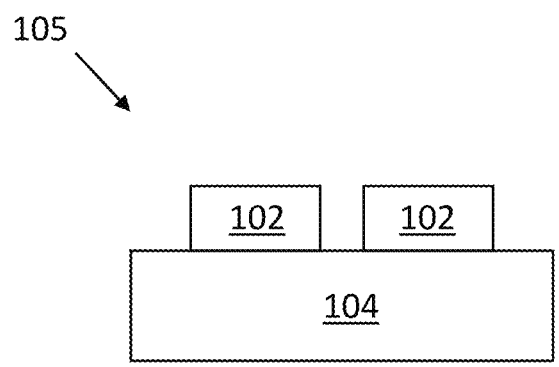
FIG. 1B illustrates one or more antenna boards bonded to an integrated circuit chip, in accordance with another embodiment of the present disclosure.

FIG. 1B illustrates another RF module 105 that includes one or more antenna boards 102 bonded to an RFIC 104, according to an embodiment. One or more antenna boards 102 can be bonded to RFIC 104 using any known flip-chip bonding technique. For example, antenna boards 102 are bonded to RFIC 104 using a ball grid array (BGA) or a C4 technique. In other examples, antenna boards 102 are bonded to RFIC 104 using wire bonding. The various details of antenna board 102 and RFIC 104 are the same between RF module 100 and RF module 105.

Figure 2A:
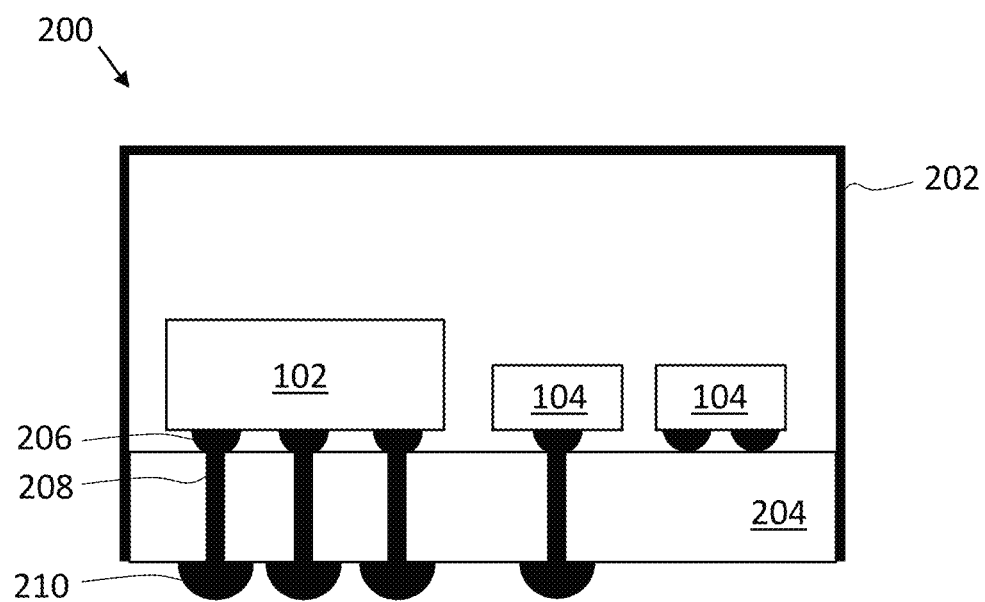
FIG. 2A illustrates a side, cross-sectional view of a chip package having one or more antenna boards and one or more integrated circuit chips, in accordance with an embodiment of the present disclosure.
Figure 2B:
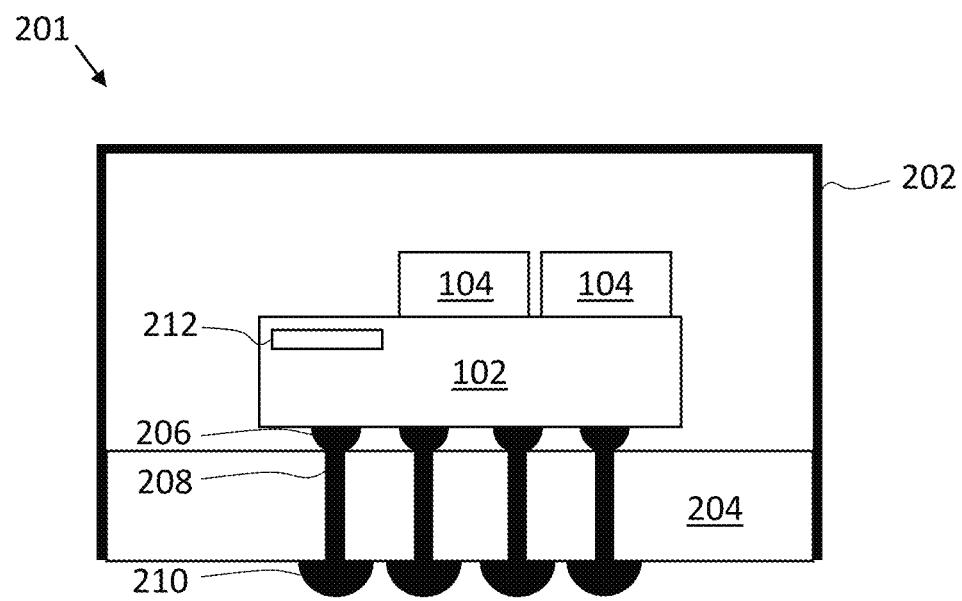
FIG. 2B illustrates a side, cross-sectional view of another chip package having one or more antenna boards and one or more integrated circuit chips, in accordance with an embodiment of the present disclosure.

FIGS. 2A and 2B illustrate example embodiments of chip packages 200 and 201, respectively. In FIG. 2A, chip package 200 may include a housing 202 that protects one or more RFICs 104 and antenna boards 102 present within chip package 200. According to an embodiment, chip package 200 includes a package substrate 204 upon which RFICs 104 and antenna board(s) 102 are bonded. RFICs 104 and antenna board(s) 102 may be conductively coupled to package substrate 204 using first-level interconnects 206. In particular, conductive contacts at one face of package substrate 204 may be coupled to conductive contacts at faces of antenna board 102 and/or RFICs 104 by first-level interconnects 206.

In the illustrated embodiment, first-level interconnects 206 are solder bumps, but any suitable first-level interconnects 206 may be used (e.g., pins in a pin grid array arrangement or lands in a land grid array arrangement). In some embodiments, a solder resist is disposed between first-level interconnects 206. Package substrate 204 may include a dielectric material, and may have conductive pathways (e.g., including conductive vias and lines) extending through the dielectric material between the faces, or between different locations on each face. In some embodiments, package substrate 204 may have a thickness less than 1 millimeter (e.g., between 0.1 millimeters and 0.5 millimeters). Additional conductive contacts may be disposed at an opposite face of package substrate 204 for conductively contacting second-level interconnects 210. One or more vias 208 extend through a thickness of package substrate 204 to provide conductive pathways between one or more of first-level interconnects 206 to one or more of second-level interconnects 210. Vias 208 are illustrated as single straight columns through package substrate 204 for ease of illustration and, in some embodiments, vias 208 are fabricated by multiple smaller stacked vias, or are staggered at different locations across package substrate 204. Second-level interconnects 210 may be used to electrically connect the components of chip package 200 to other conductive contacts on, for example, a circuit board. In the illustrated embodiment, second-level interconnects 210 are solder balls (e.g., for a ball grid array arrangement), but any suitable second-level interconnects 210 may be used (e.g., pins in a pin grid array arrangement or lands in a land grid array arrangement). In some embodiments, a solder resist is disposed between second-level interconnects 210.

In FIG. 2B, chip package 201 also may include a housing 202 that encompasses an RF module, such as RF module 100 or RF module 105. The packaged RF module includes both RF circuitry and one or more 3-D antennas integrated together either on the same substrate, or on different substrates bonded together. In the illustrated example, antenna board 102 includes an integrated antenna 212 that is in a separate portion of antenna board 102 from where RFICs 104 are bonded. The separation between antenna 212 and RFICs 104 may be performed to ensure that the antenna is not obstructed from sending and/or receiving electromagnetic signals. Chip package 201 may also include package substrate 204, first-level interconnects 206, vias 208, and second-level interconnects 210 as discussed above with reference to FIG. 2A.

In some embodiments, antenna 212 is integrated directly into package substrate 204. In such embodiments, antenna board 102 may be removed as package substrate 204 takes on the "role" of the antenna board. If antenna board 102 is not used, RFICs 104 can be bonded directly to package substrate 204 as illustrated in FIG. 2A. As discussed above, antenna 212 may be located in a portion of package substrate 204 separate from a portion of package substrate 204 where RFICs 104 are bonded.

By incorporating both antenna board 102 and RFICs 104 together in the same chip package 200 or 201, a small form factor is maintained while still allowing for an RF front end that can cover a very wide frequency range (e.g., 24-71 GHz.) Furthermore, the use of one or more 3-D antennas, such as a monocone antenna structure, as part of antenna board 102 helps to create a wide impedance bandwidth. A reduction in Z-height may also be achieved by integrating antennas and other circuits together in a same chip package.

Figure 3A:
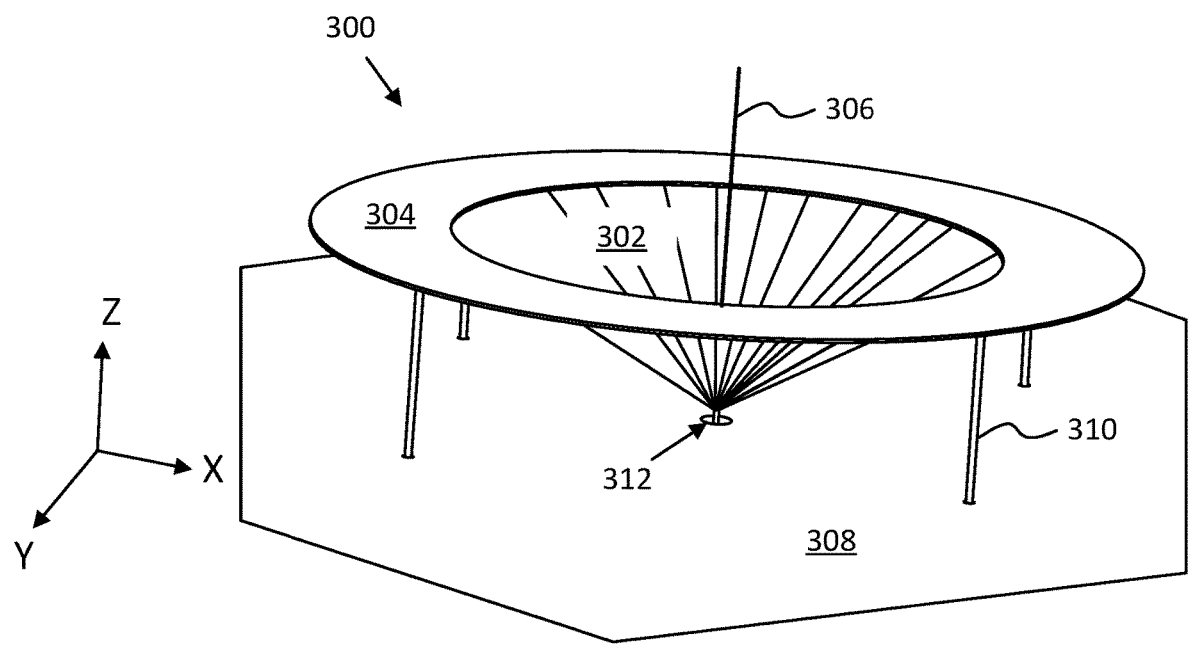
FIGS. 3A and 3B each illustrates a 3-D view of a monocone antenna, in accordance with an embodiment of the present disclosure.
Figure 3B:
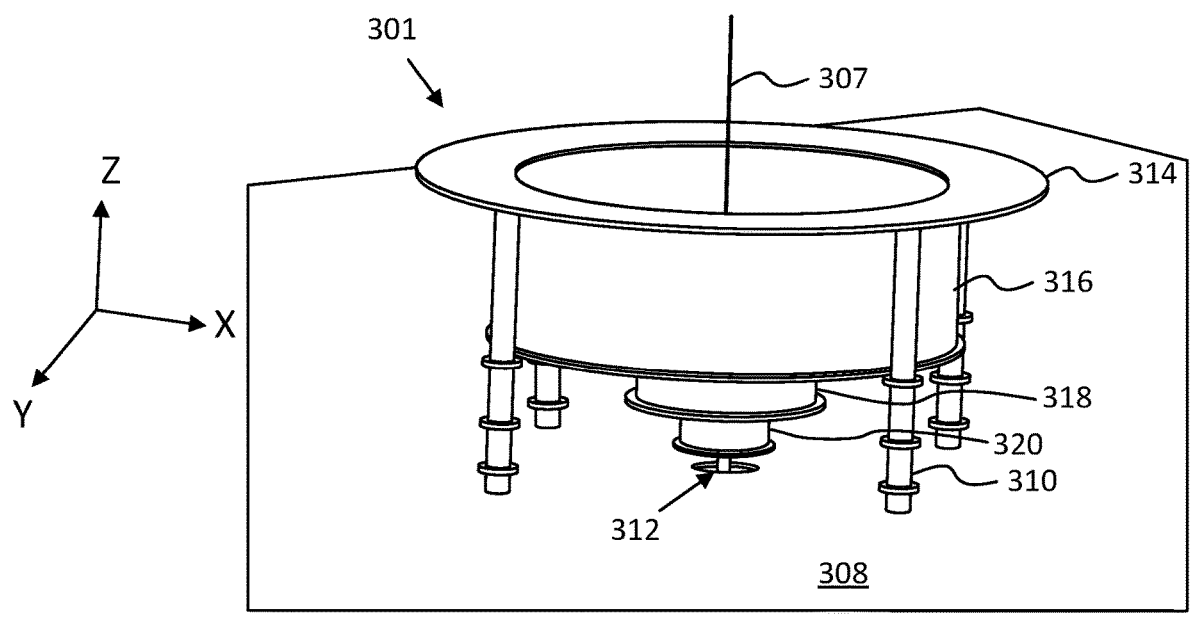

FIGS. 3A and 3B illustrate example 3-D antenna structures, according to some embodiments. FIG. 3A illustrates an example of a 3-D monocone antenna 300. Monocone antenna 300 may be an example of one or more of the antennas present on antenna board 102. Monocone antenna 300 is made of a conductive material, such as a metal, and is formed above a ground plane 308, also made of a conductive material, such as a metal. In one example, both monocone antenna 300 and ground plane 308 are copper. Monocone antenna 300 generally includes two regions: a sloped region 302, and a planar region 304.

Sloped region 302 may have a cone shape that tapers down to a point, or towards a point in space. An axis 306 may pass through a center of sloped region 302 and pass through the point towards which sloped region 302 tapers. Sloped region 306 may extend away from axis 306 at a same angle about axis 306 to form the cone shape. According to an embodiment, sloped region 302 has a largest radius of between about 1 mm and about 2 mm. According to an embodiment, sloped region 302 has a height between about 0.5 mm and about 1.5 mm.

Planar region 304 may extend radially around a circumference of sloped region 302. In an embodiment, planar region 304 has an outer radius between about 1.75 mm and about 2.75 mm. In some embodiments, pins 310 conductively connect planar region 304 to ground plane 308. Pins 310 may also be made from a conductive material, such as a metal, and may have a radius between about 25 μm and about 150 μm. Although four pins 310 are illustrated, any number of pins 310 may be used between planar region 304 and ground plane 308.

At or near the tip of sloped region 302 is a conductor that extends through an opening 312 in ground plane 308. The conductor may extend to another conductor beneath ground plane 312 to provide one of the differential connections to the antenna.

FIG. 3B illustrates an example of a 3-D antenna 301 that uses a stepped structure to approximate a cone shape, according to an embodiment. The stepped structure may be easier and less costly to fabricate compared to the smoother cone shape of 3-D monocone antenna 300. 3-D antenna 301 is made of a conductive material, such as a metal, and is formed above a ground plane 308, also made of a conductive material, such as a metal. In one example, both 3-D antenna 301 and ground plane 308 are copper.

According to an embodiment, 3-D antenna 301 includes a plurality of levels 316/318/320 each having a different radius about a central axis 307. Although three levels are illustrated, any number of levels may be used, each having a smaller radius as they approach closer to ground plane 308. A planar region 314 extends outward at a top level of 3-D antenna 301.

As noted above, each of the different levels of 3-D antenna 301 have a decreasingly smaller radius leading down to a conductive connection extending through opening 312 in ground plane 308. In an embodiment, each of the different levels of 3-D antenna 301 also have a decreasingly shorter height leading down towards ground plane 308. In an embodiment, 3-D antenna also includes pins 310 that conductively connect planar region 314 to ground plane 308. Pins 310 may also be made from a conductive material, such as a metal, and may have a radius between about 25 μm and about 150 μm. Although four pins 310 are illustrated, any number of pins 310 may be used between planar region 314 and ground plane 308.

According to one example, planar region 314 has an outer radius between about 750 μm and about 850 μm. According to one example, a first region 316 has an outer radius between about 550 μm and about 650 μm, and a height between about 350 μm and about 450 μm. According to one example, a second region 318 has an outer radius between about 200 μm and about 300 μm, and a height between about 100 μm and about 200 μm. According to one example, a third region 320 has an outer radius between about 50 μm and about 150 μm, and a height between about 50 μm and about 150 μm.

3-D Antenna Fabrication

Figure 4:
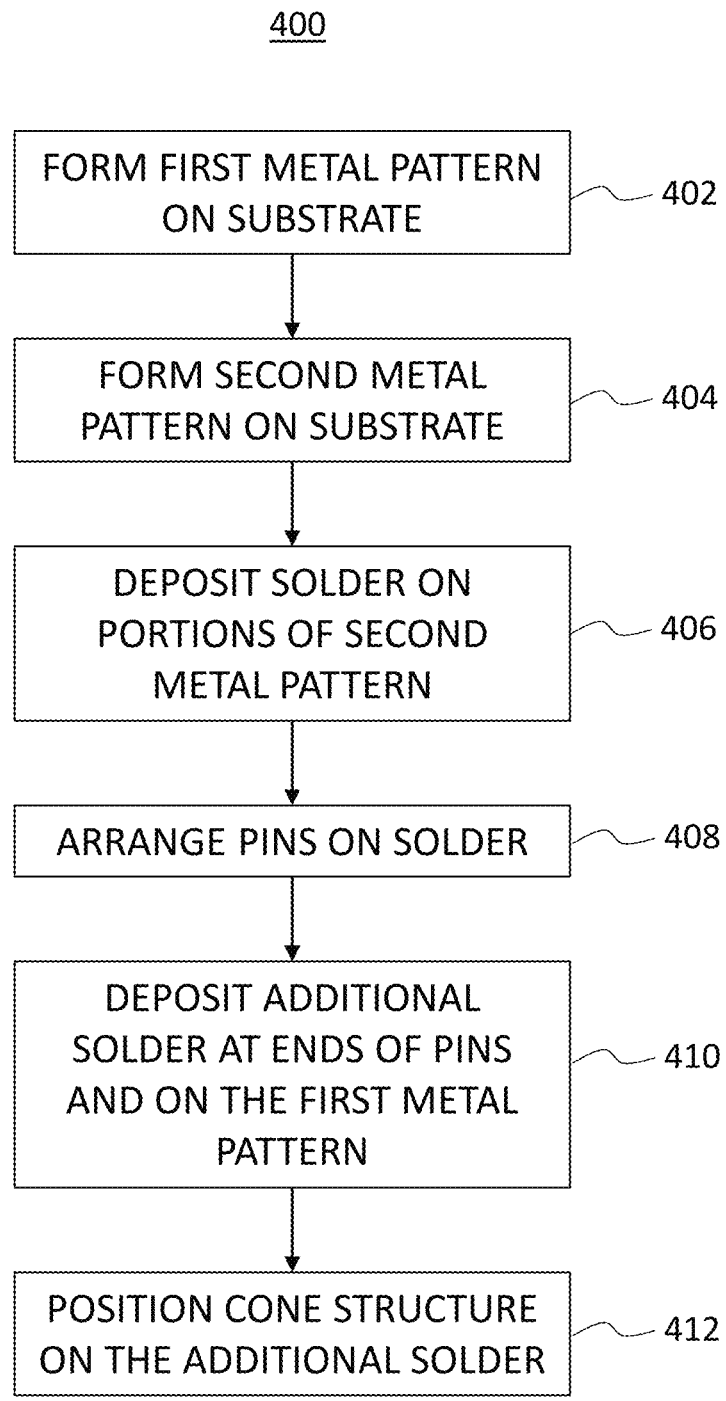
FIG. 4 is a flow chart of an example method for fabricating a 3D antenna, in accordance with an embodiment of the present disclosure.

FIG. 4 is a flow chart of a method 400 for fabricating a 3-D antenna, such as monocone antenna 300, according to an embodiment. Various operations of method 400 are illustrated in FIGS. 5A-5D. Accordingly, reference may be made to any of FIGS. 5A-5D when discussing the operations of method 400. However, the correlation of the various operations of method 400 to the specific components illustrated in FIGS. 5A-5D is not intended to imply any structural and/or use limitations. Rather, FIGS. 5A-5D provide one example embodiment of method 400.

Figure 5A:
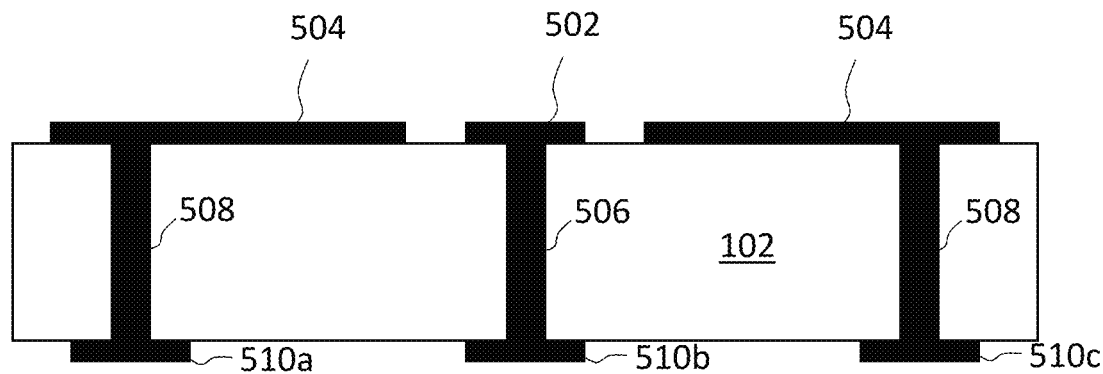
FIGS. 5A-5D illustrate example structures that are formed during a fabrication process in accordance with the method of FIG. 4, in accordance with some embodiments of the present disclosure.

Method 400 begins at operation 402 where a first metal pattern is formed on a substrate. As shown in FIG. 5A, antenna board 102 acts as a substrate, and a first metal pattern 502 is formed on a top surface of antenna board 102. First metal pattern 502 may be any suitable metal or metal alloy material, such as copper, gold, or aluminum, and may include more than one layer of deposited metal. First metal pattern 502 may be patterned using standard lithography techniques.

Method 400 continues with operation 404 where a second metal pattern is formed on the substrate. As shown in FIG. 5A, a second metal pattern 504 is formed on the top surface of antenna board 102. Second metal pattern 504 may be any suitable metal or metal alloy material, such as copper, gold, or aluminum, and may include more than one layer of deposited metal. Second metal pattern 504 may be patterned using standard lithography techniques.

According to an embodiment, second metal pattern 504 is arranged around first metal pattern 502. In one example, second metal pattern 504 completely surrounds first metal pattern 502. Although second metal pattern 504 is illustrated as being on the same plane as first metal pattern 502, this is not required. In some embodiments, second metal pattern 504 is formed first on antenna board 102, followed by depositing a dielectric layer over second metal pattern 504, and forming first metal pattern 502 over the deposited dielectric layer such that first metal pattern 502 is above second metal pattern 504.

According to an embodiment, a via 506 is formed through a thickness of antenna board 102 that makes conductive contact with first metal pattern 502. Via 506 may be a single via formed through an entire thickness of antenna board 102, or via 506 may represent multiple stacked vias. In another example, various metal layers and vias formed throughout the thickness of antenna board 102 are used. Vias 508 are formed similarly to via 506 for making conductive contact with second metal pattern 504. According to an embodiment, a plurality of conductive contacts 510a-510c are formed on a bottom surface of antenna board 102, and are conductively contacted with vias 506 or 508. Conductive contacts 510a-510c may act as contacts for flip-chip bonding of antenna board 102 to another substrate.

Figure 5B:
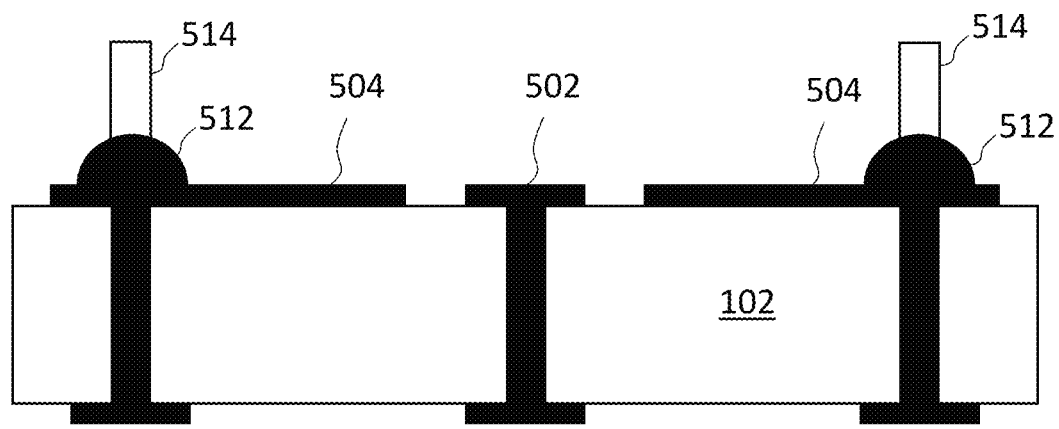

Method 400 continues with operation 406 where solder is deposited on portions of the second metal pattern 504. As illustrated in FIG. 5B, solder points 512 are deposited on portions of second metal pattern 504. Any number of solder points 512 may be deposited on second metal pattern 504. Solder points 512 may each be arranged at a same distance from first metal pattern 502, such that solder points 512 lie on the circumference of a circle.

Method 400 continues with operation 408 where pins are arranged on the solder. As illustrated in FIG. 5B, pins 514 are disposed vertically at each solder point, according to an embodiment. Pins 514 may be any conductive material, such as copper, and may have a radius between about 50 μm and about 350 μm. The height of pins 514 can vary depending on the desired height of the 3-D antenna. In one example, the height of pins 514 is about 1 mm.

Figure 5C:
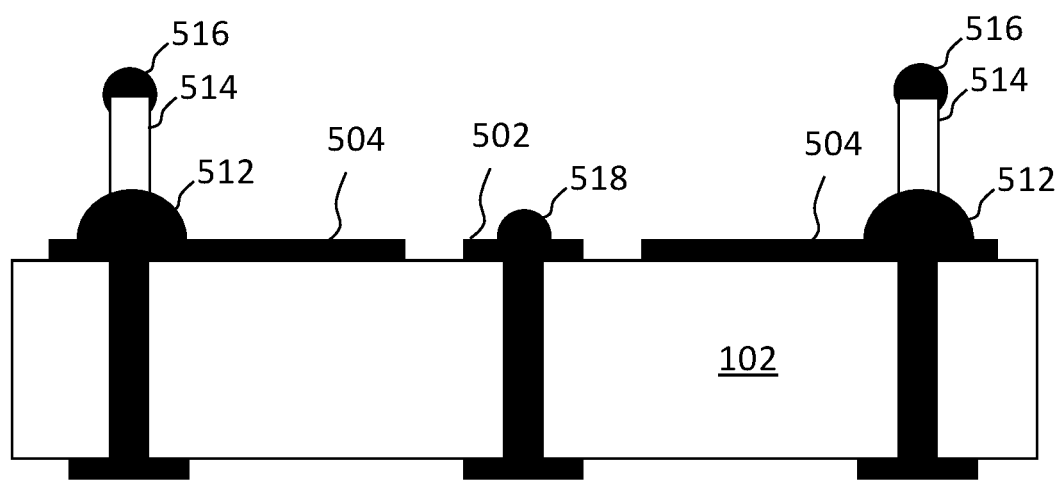

Method 400 continues with operation 410 where additional solder is deposited at the ends of the pins and on the first metal pattern. As illustrated in FIG. 5C, additional solder points 516 are made at the tips of each of pins 514, while another one or more solder points 518 is made on first metal pattern 502. In one embodiment, one or more solder points 518 on first metal pattern 502 is located equidistant from each of solder points 512. Solder points 516 may be formed by dipping the ends of pins 514 into solder.

Figure 5D:
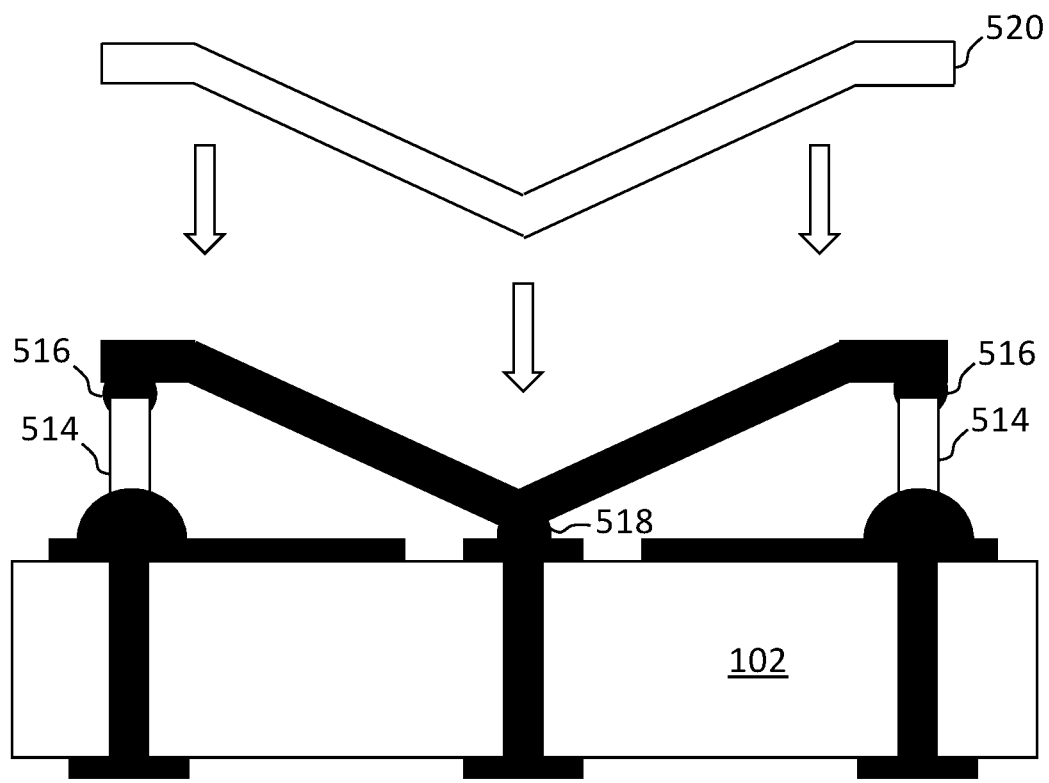

Method 400 continues with operation 412 where a cone structure is positioned on the additional solder points at the ends of the pins and on the first metal pattern. As shown in FIG. 5D, cone structure 520 is placed on additional solder points 516 and 518, such that cone structure 520 is supported by pins 514. Cone structure 520 may be any metal material, such as copper. Cone structure 520 may have an inner radius between about 1 mm and about 2 mm. Cone structure 520 completes the 3-D antenna with one contact being made via solder point 518 to first metal pattern 502 at or near a tip of cone structure 520. Additionally, a planar top edge of cone structure 520 is shunted to a ground plane (second metal pattern 504) via pins 514. According to an embodiment, the 3-D antenna fabricated from method 400 is a free-standing structure above antenna board 102 and has air around the antenna components. In some embodiments, thermal compression bonding or solder reflow with elevated temperature is used to ensure a strong bond between cone structure 520 and solder points 516 and 518.

Figure 6:
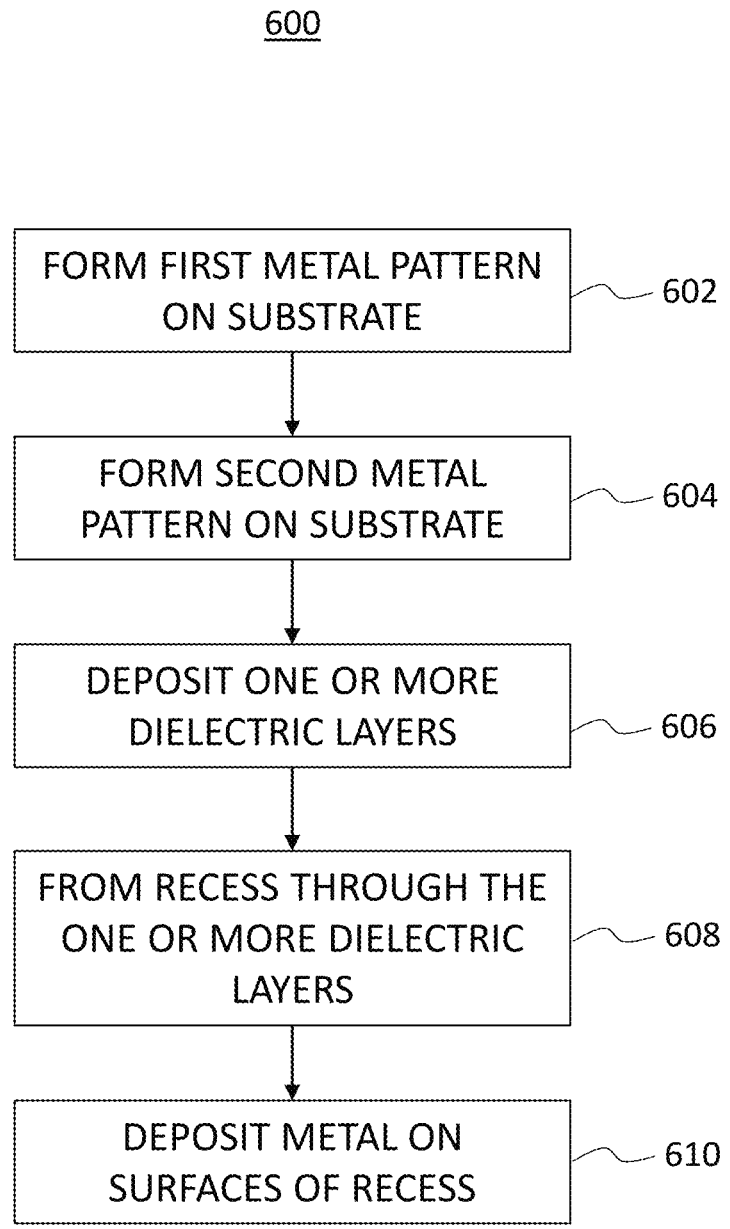
FIG. 6 is a flow chart of another example method for fabricating a 3D antenna, in accordance with an embodiment of the present disclosure.

FIG. 6 is a flow chart of another method 600 for fabricating a 3-D antenna, according to an embodiment. Various operations of method 600 are illustrated in FIGS. 7A-7D. Accordingly, reference may be made to any of FIGS. 7A-7D when discussing the operations of method 600. However, the correlation of the various operations of method 600 to the specific components illustrated in FIGS. 7A-7D is not intended to imply any structural and/or use limitations. Rather, FIGS. 7A-7D provide one example embodiment of method 600.

Figure 7A:
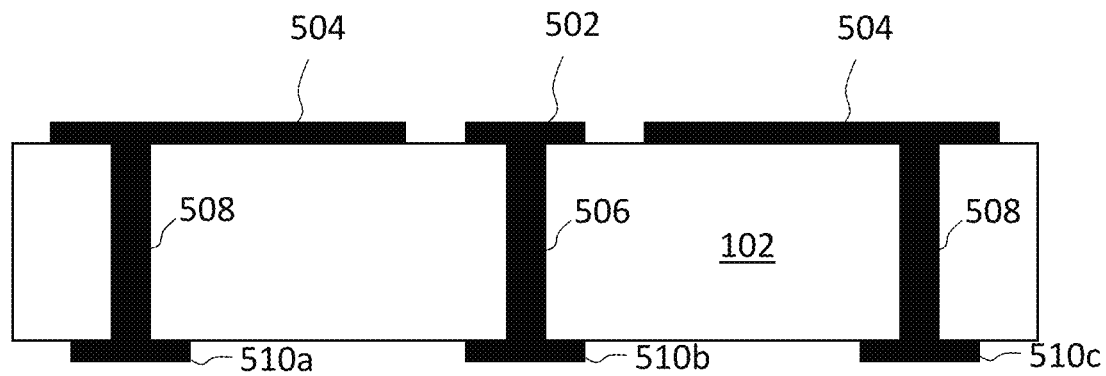
FIGS. 7A-7D illustrate example structures that are formed during a fabrication process in accordance with the method of FIG. 6, in accordance with some embodiments of the present disclosure.

Method 600 begins at operation 602 where a first metal pattern is formed on a substrate. Method 600 continues with operation 604 where a second metal pattern is formed on a substrate. FIG. 7A illustrates the formation of first metal pattern 502 and second metal pattern 504. The formation of these metal patterns is the same as described above with reference to FIG. 5A, and thus the details are not repeated.

Figure 7B:
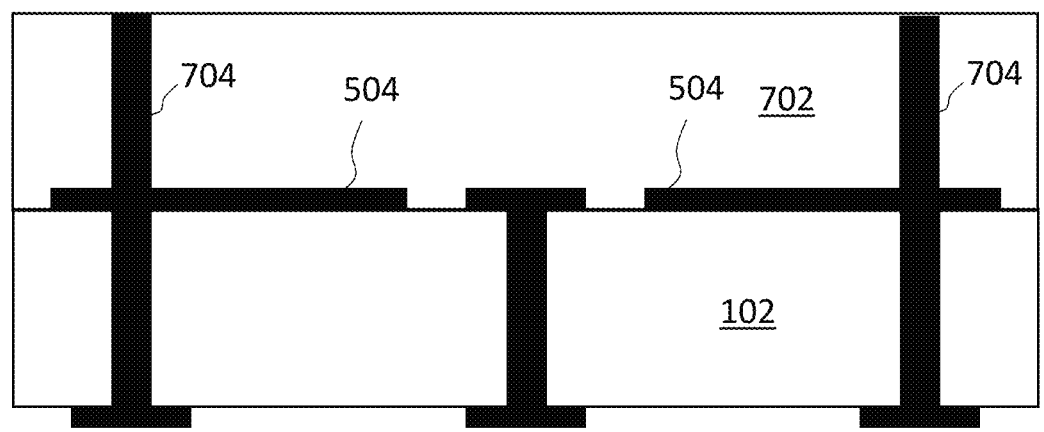

Method 600 continues with operation 606 where one or more dielectric layers are deposited on the substrate over the first and second metal patterns. FIG. 7B illustrates one or more dielectric layers 702 deposited over antenna board 102. One or more dielectric layers 702 may include any number of dielectric layers having the same material or different materials. The dielectric material may be silicon oxide or silicon nitride. In some examples, any of the one or more dielectric layers includes a bismaleimide triazine (BT) resin, polyimide material, glass reinforced epoxy matrix material, high-k dielectric, low-k or ultra low-k dielectric (e.g., carbon-doped dielectric, fluorine-doped dielectric, porous dielectric, or organic polymeric dielectric). The one or more dielectric layers may be deposited using any standard deposition technique, such as physical vapor deposition (PVD) or chemical vapor deposition (CVD).

According to an embodiment, one or more vias 704 are formed through a thickness of one or more dielectric layers 702. One or more vias 704 contact second metal pattern 504. One or more vias 704 may each be a single via formed through an entire thickness of one or more dielectric layers 702, or each of one or more vias 704 may represent multiple stacked vias. In another example, various metal layers and vias formed throughout the thickness of one or more dielectric layers 702 are used.

Figure 7C:
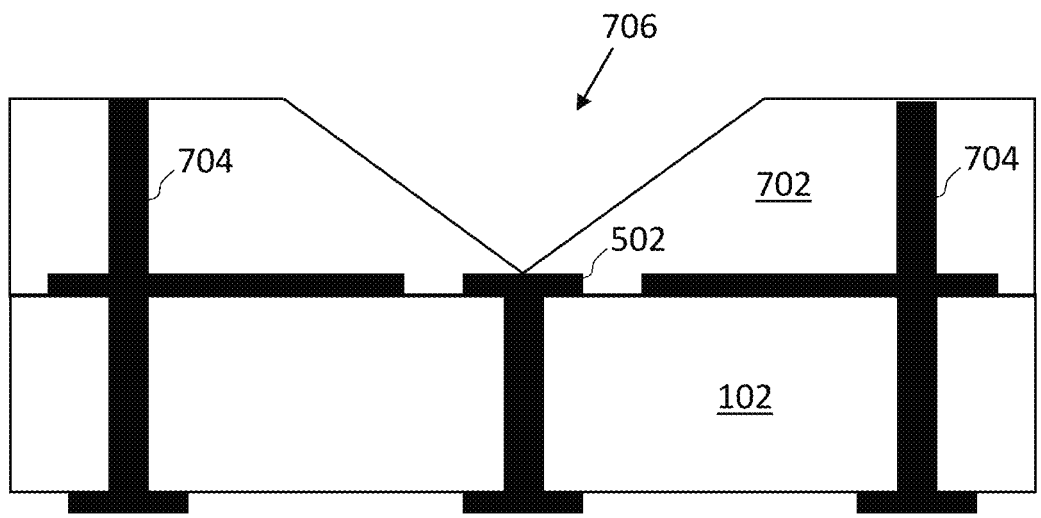

Method 600 continues with operation 608 where a recess is formed in the one or more dielectric layers. FIG. 7C illustrates a recess 706 formed through one or more dielectric layers 702 and aligned over first metal pattern 502. In one embodiment, a portion of first metal pattern 502 is exposed by recess 706. Recess 706 may be formed by using a cone-shaped bit that is drilled into one or more dielectric layers 702. In some embodiments, recess 706 extends outward into a portion of one or more vias 704. Although a cone shape is illustrated, other shapes are possible as well to form 3-D antennas with varying shapes.

Figure 7D:
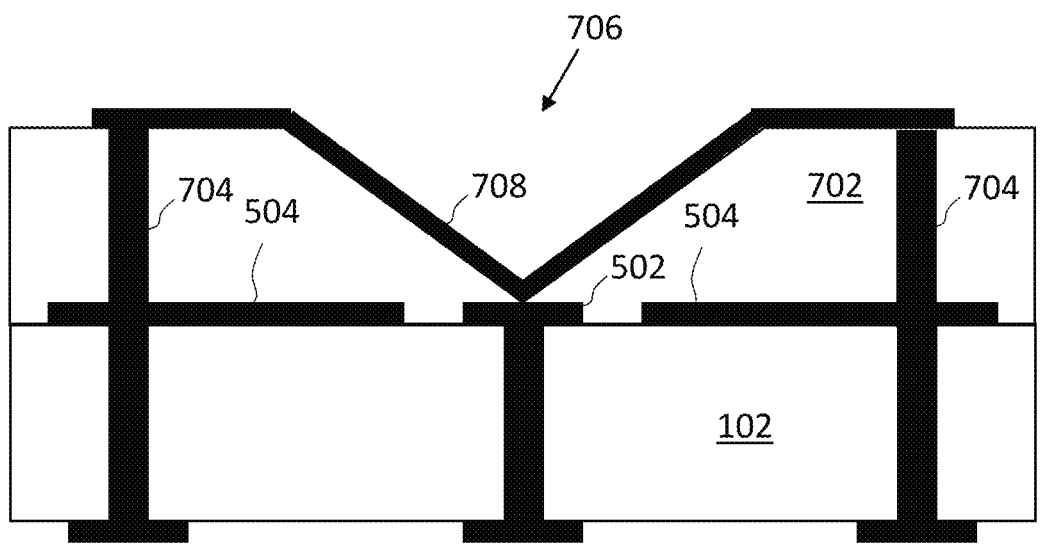

Method 600 continues with operation 610 where metal is deposited on the surfaces of the recess and along a portion of the top surface of the one or more dielectric layers. FIG. 7D illustrates the deposition of metal 708 along the surfaces of recess 706. Metal 708 may be the same material as first metal pattern 502 and second metal pattern 504. Metal 708 may be copper, gold, aluminum, or any alloy thereof. In some embodiments, metal 708 is deposited by a PVD process, such as sputtering. In some embodiments, metal 708 is depositing using a CVD process. Metal 708 may also be deposited along a top surface of one or more dielectric layers 702, such that metal 708 forms a top planar region that makes conductive contact with one or more vias 704. In some embodiments, the remainder of recess 706 over metal 708 is filled with any of the dielectric materials discussed previously for one or more dielectric layers 702. According to an embodiment, the deposition of metal 708 completes the 3-D antenna structure with one contact being made via the bottom of recess 706 at first metal pattern 502. Additionally, the planar top edge of metal 708 is shunted to a ground plane (second metal pattern 504) using one or more vias 704.

Figure 8:
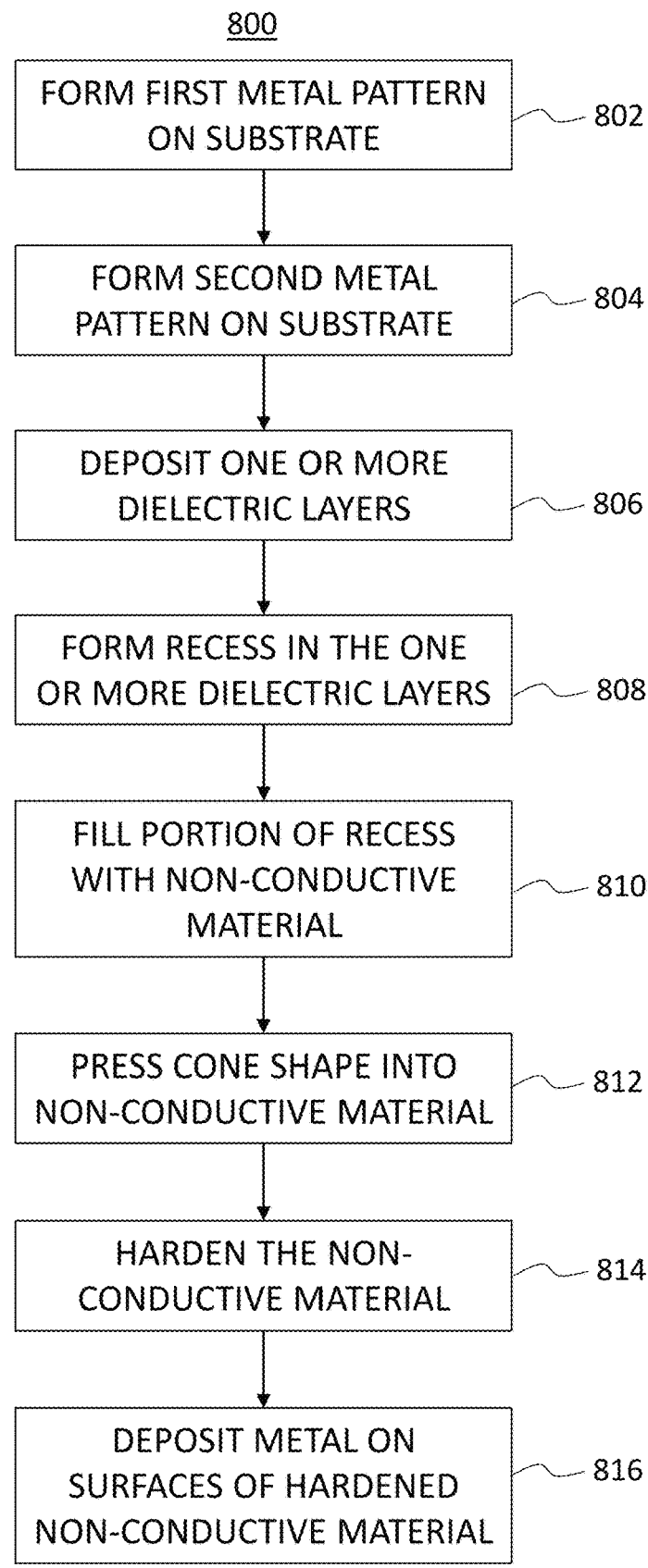
FIG. 8 is a flow chart of another example method for fabricating a 3D antenna, in accordance with an embodiment of the present disclosure.

FIG. 8 is a flow chart of another method 800 for fabricating a 3-D antenna, according to an embodiment. Various operations of method 800 are illustrated in FIGS. 9A-9D. Accordingly, reference may be made to any of FIGS. 9A-9D when discussing the operations of method 800. However, the correlation of the various operations of method 800 to the specific components illustrated in FIGS. 9A-9D is not intended to imply any structural and/or use limitations. Rather, FIGS. 9A-9D provide one example embodiment of method 800.

Figure 9A:
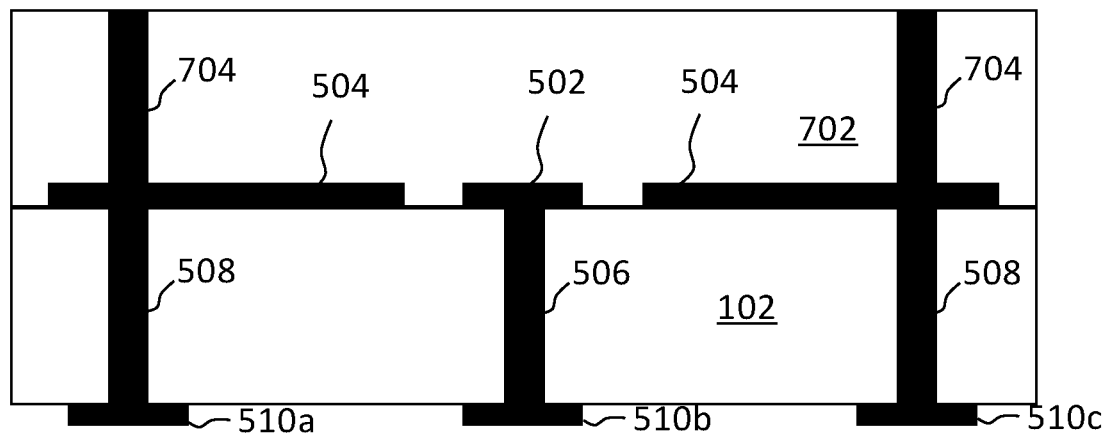
FIGS. 9A-9D illustrate example structures that are formed during a fabrication process in accordance with the method of FIG. 8, in accordance with some embodiments of the present disclosure.

Method 800 begins at operation 802 where a first metal pattern is formed on a substrate. Method 800 continues with operation 804 where a second metal pattern is formed on a substrate. Method 800 continues with operation 806 where one or more dielectric layers are deposited on the substrate over the first and second metal patterns. FIG. 9A illustrates the formation of first metal pattern 502, second metal pattern 504, and one or more dielectric layers 702. The formation of these metal patterns is the same as described above with reference to FIG. 5A, and thus the details are not repeated. Similarly, the formation of one or more dielectric layers 702 is the same as described above with reference to FIG. 7A, and thus the details are not repeated.

Figure 9B:
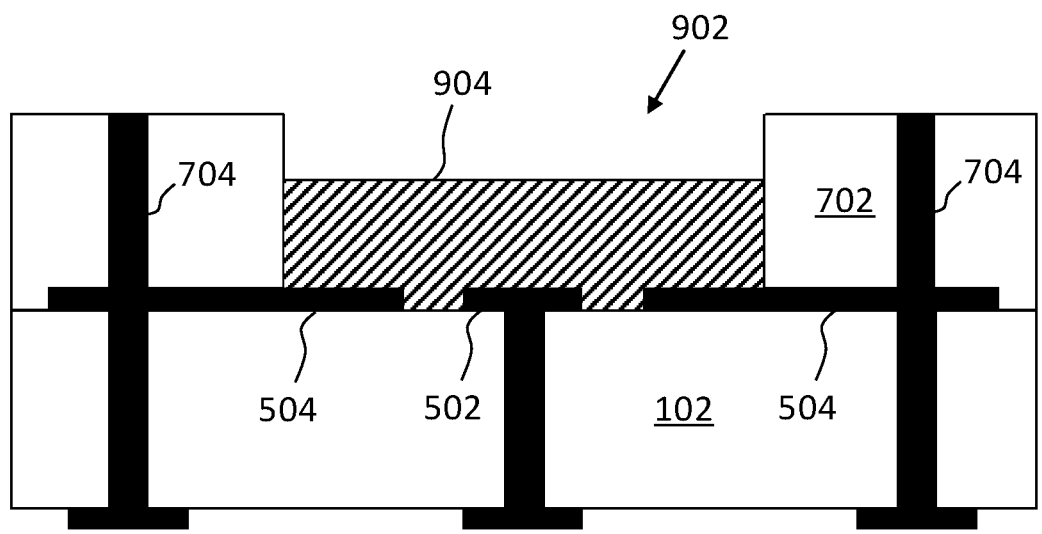

Method 800 continues with operation 808 where a recess is formed through the one or more dielectric layers. FIG. 9B illustrates a recess 902 being formed through one or more dielectric layers 702. According to an embodiment, recess 902 exposes at least a portion of first metal pattern 502. In some embodiments, recess 902 exposes all of first metal pattern 502. Furthermore, recess 902 may expose a portion of second metal pattern 504. In some embodiments, recess 902 extends the entire distance between one or more vias 704. Recess 902 may have substantially straight sidewalls (e.g., at an angle of less than 10 degrees.) Recess 902 may be formed using standard etching techniques, such as reactive ion etching (RIE) or deep reactive ion etching (DRIE). In some examples, wet etchants, such as buffered oxide etchant, are used to form recess 902.

Method 800 continues with operation 810 where a portion of the recess is filled with a non-conductive material. In some examples, at least 5%, at least 10%, at least 15%, at least 20%, at least 25%, at least 30%, at least 50%, at least 60%, at least 75%, or at least 90% of the volume of recess 902 is filled with non-conductive material 904 as illustrated in FIG. 9B. Accordingly, non-conductive material 904 may cover all of first metal pattern 502 and portions of second metal pattern 504 after it has been disposed within recess 902.

According to some embodiments, non-conductive material 904 is an epoxy. The epoxy may be curable using UV light and/or elevated temperature. Other examples of non-conductive material 904 include photocurable polymers. Any other non-conductive materials having a viscosity between about 100 cPs and 10,000 cPs may be used as well.

Figure 9C:
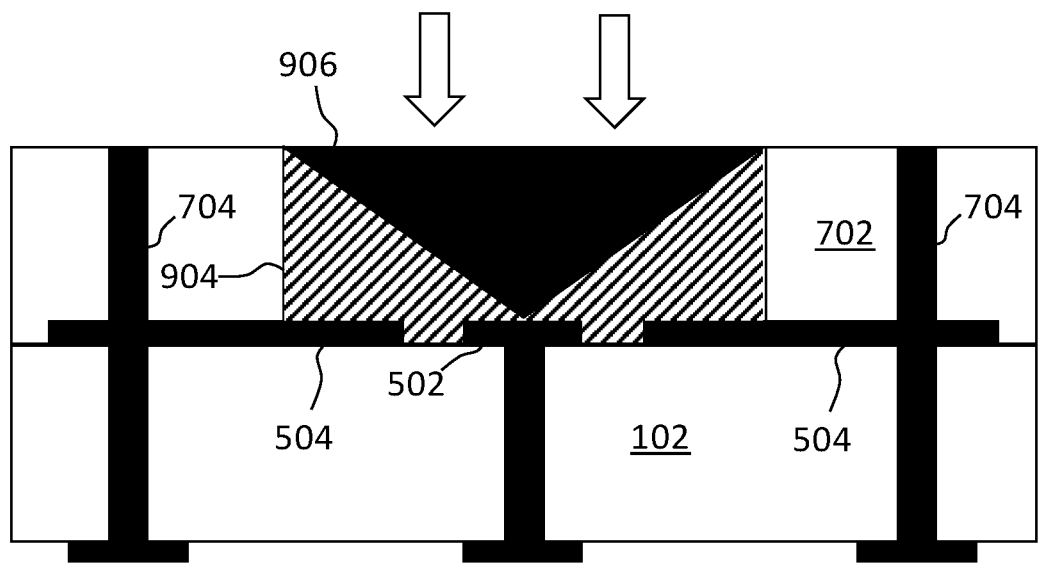

Method 800 continues with operation 812 where a cone shape is pressed into the non-conductive material. FIG. 9C illustrates how a bit shape 906 is pressed into non-conductive material 904, thus forming the shape of bit shape 906 in the non-conductive material 904, according to an embodiment. A cone shape is one possible shape for bit shape 906, but other shapes may be used as well.

According to an embodiment, bit shape 906 is pressed into non-conductive material 904 such that at least a portion of first metal pattern 502 is contacted by bit shape 906. Said another way, the pressing of bit shape 906 into non-conductive material 904 moves non-conductive material 904 away from at least a portion of first metal pattern 502.

Method 800 continues with operation 814 where the non-conductive material is hardened or cured. Bit shape 906 may remain in non-conductive material 904 while it is being hardened, and then removed after non-conductive material 904 has been hardened. Non-conductive material 904 may be hardened using UV radiation, increased temperature, or exposure to a cross-linking agent. According to an embodiment, after non-conductive material 904 has been hardened, at least a portion of first metal pattern 502 is exposed with no non-conductive material 904 covering it. According to an embodiment, the hardened non-conductive material 904 covers all of second metal pattern 504 within recess 902.

Figure 9D:
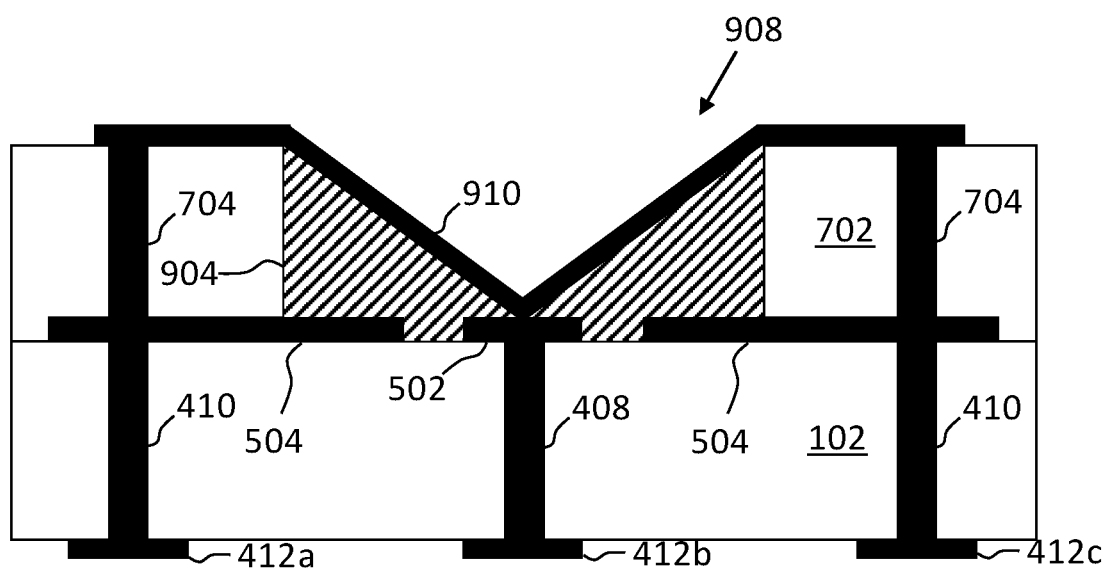

Method 800 continues with operation 816 where metal is deposited on the surfaces of the hardened non-conductive material. According to an embodiment, FIG. 9D illustrates how metal 910 is also deposited over a portion of first metal pattern 502 and along a top surface of one or more dielectric layers 702. Metal 910 may be the same material as first metal pattern 502 and second metal pattern 504. Metal 910 may be copper, gold, aluminum, or any alloy thereof. In some embodiments, metal 910 is deposited by a PVD process, such as sputtering. In some embodiments, metal 910 is depositing using a CVD process. Metal 910 may be deposited along a top surface of one or more dielectric layers 702 such that metal 910 forms a top planar region that makes conductive contact with one or more vias 704. In some embodiments, the remainder of recess 908 over metal 910 is filled with any of the dielectric materials discussed previously for one or more dielectric layers 702. According to an embodiment, the deposition of metal 910 completes the 3-D antenna structure with one contact being made via the bottom of recess 908 at first metal pattern 502. Additionally, the planar top edge of metal 910 is shunted to a ground plane (second metal pattern 504) using one or more vias 704.

Figure 10:
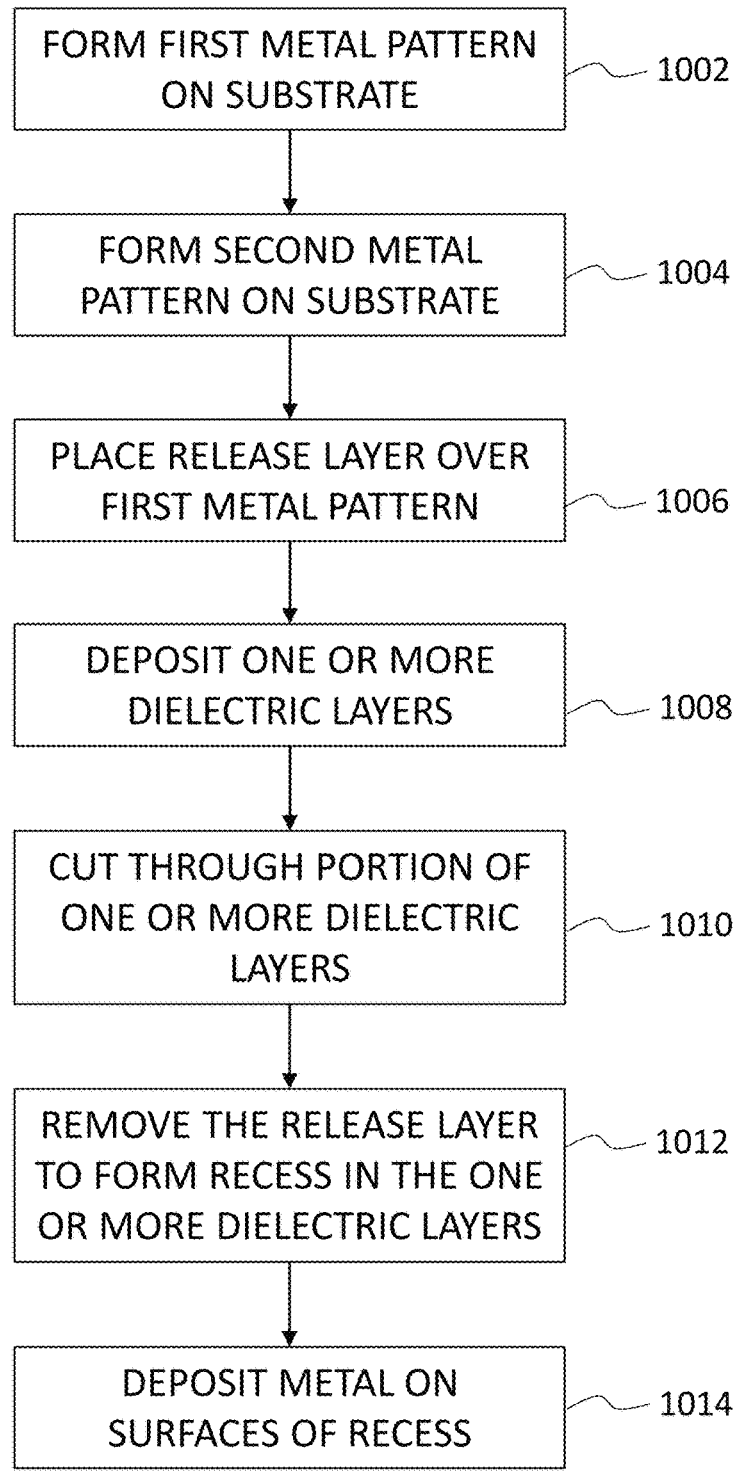
FIG. 10 is a flow chart of another example method for fabricating a 3D antenna, in accordance with an embodiment of the present disclosure.

FIG. 10 is a flow chart of another method 1000 for fabricating a 3-D antenna, according to an embodiment. Various operations of method 1000 are illustrated in FIGS. 11A-11E. Accordingly, reference may be made to any of FIGS. 11A-11E when discussing the operations of method 1000. However, the correlation of the various operations of method 1000 to the specific components illustrated in FIGS. 11A-11E is not intended to imply any structural and/or use limitations. Rather, FIGS. 11A-11E provide one example embodiment of method 1000.

Figure 11A:
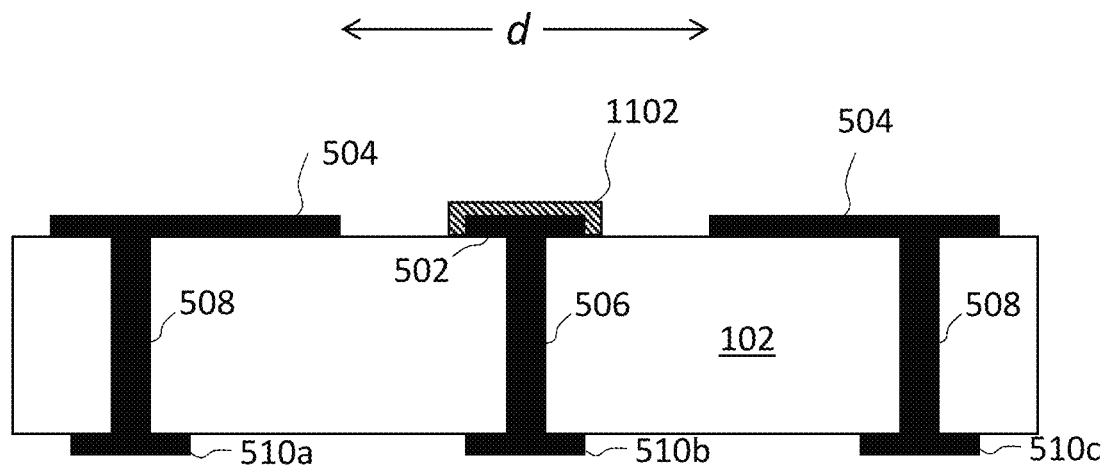
FIGS. 11A-11E illustrate example structures that are formed during a fabrication process in accordance with the method of FIG. 10, in accordance with some embodiments of the present disclosure.

Method 1000 begins at operation 1002 where a first metal pattern is formed on a substrate. Method 1000 continues with operation 1004 where a second metal pattern is formed on a substrate. FIG. 11A illustrates the formation of first metal pattern 502 and second metal pattern 504. The formation of these metal patterns is the same as described above with reference to FIG. 5A, and thus the details are not repeated. A distance d between portions of second metal pattern 504 may be between 100 µm and 500 µm.

Method 1000 continues with operation 1006 where a release layer is disposed over the first metal pattern. FIG. 11A illustrates a release layer 1102 being placed over first metal pattern 502. In some embodiments, release layer 1102 covers an entirety of first metal pattern 502. In other embodiments, release layer 1102 covers only a portion of first metal pattern 1102. Release layer 1102 may be deposited using a dry vapor deposition technique, and subsequently patterned. In other examples, release layer 1102 is a polymer film or tape that is manually placed down upon first metal pattern 1102. Some examples of release layer 1102 include Kapton tape or any other film that comprises fluoropolymers resilient enough to sustain their structure during high curing temperatures.

Figure 11B:
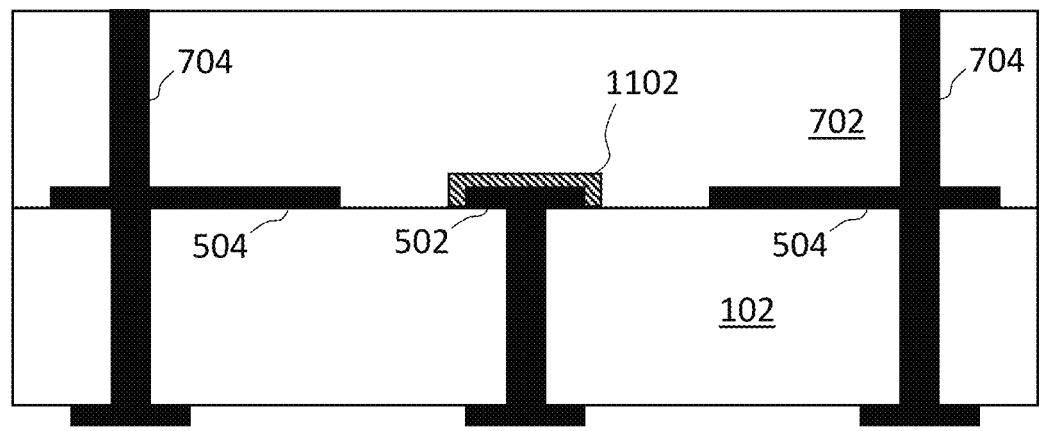

Method 1000 continues with operation 1008 where one or more dielectric layers are deposited on the substrate over the first and second metal patterns, and the release layer. FIG. 11B illustrates the formation of one or more dielectric layers 702, including one or more vias 704 through a thickness of one or more dielectric layers 702. The formation of one or more dielectric layers 702 is the same as described above with reference to FIG. 7A, and thus the details are not repeated.

Figure 11C:
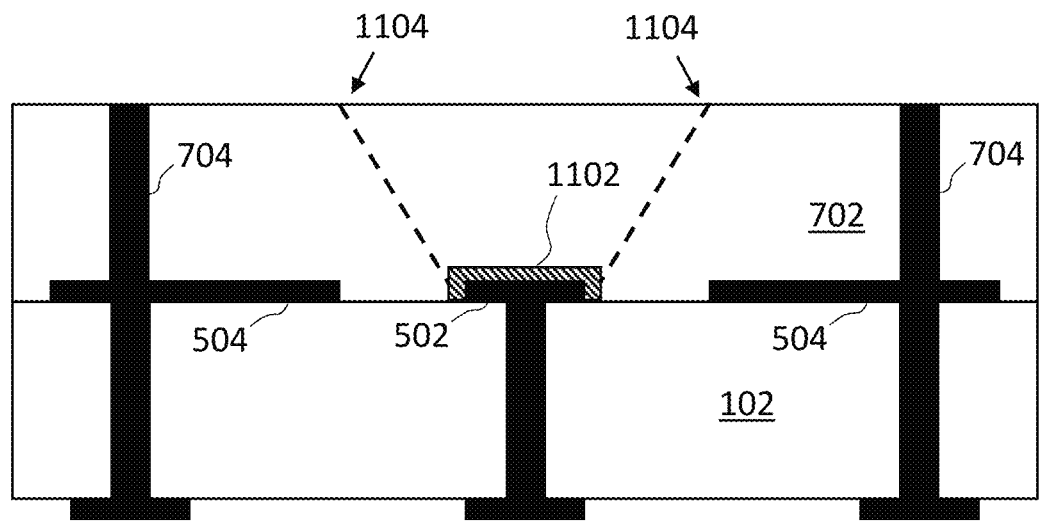

Method 1000 continues with operation 1010 where a portion of the one or more dielectric layers is cut through down to at least the release layer. FIG. 11C illustrates slices 1104 being made through a thickness of one or more dielectric layers 702 and extending down to release layer 1102. According to an embodiment, slices 1104 are made using a laser. Release layer 1102 may act as an etch stop for the laser cutting through one or more dielectric layers 702. In some embodiments, the amount of taper present in slices 1104 is controlled based on the power and angle of the laser. Other techniques may be used as well, such as focused ion beam (FIB), to form slices 1104 through one or more dielectric layers 702.

Figure 11D:
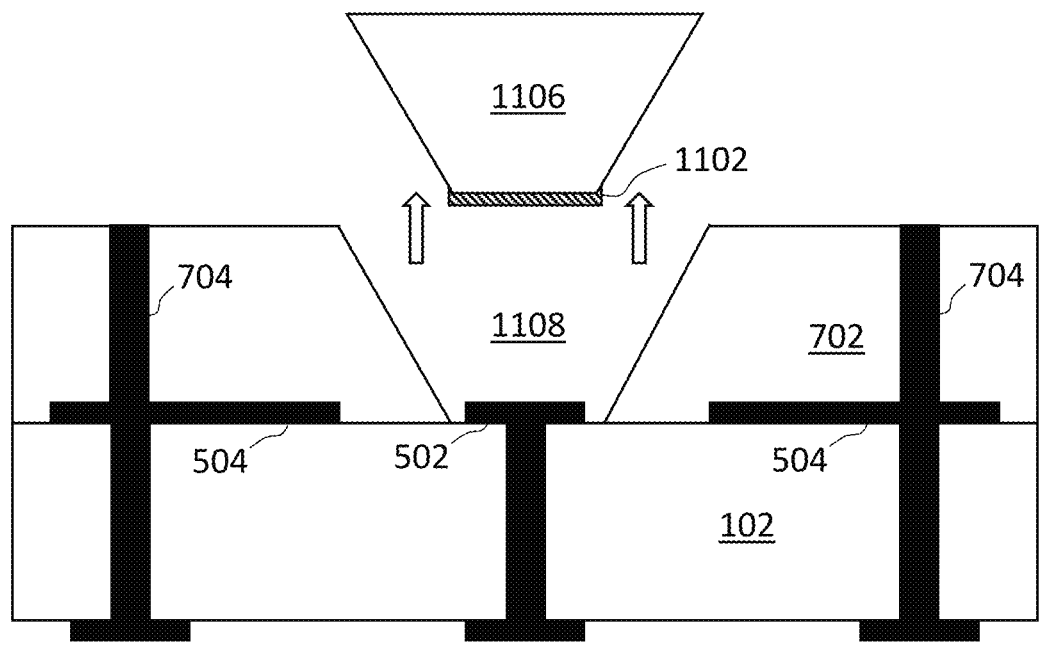

Method 1000 continues with operation 1012 where the release layer is removed to form a recess in the one or more dielectric layers. FIG. 11D illustrates the removal of a cut portion 1106 of one or more dielectric layers 702 by lifting away release layer 1102. The removal of cut portion 1106 leaves behind a recess 1108 having substantially the same shape as cut portion 1106. According to some embodiments, recess 1108 exposes at least a portion of, or all of, first metal pattern 502. In some embodiments, release layer 1102 is etched away using a wet etchant or a dry vapor etchant to release cut portion 1106.

Figure 11E:
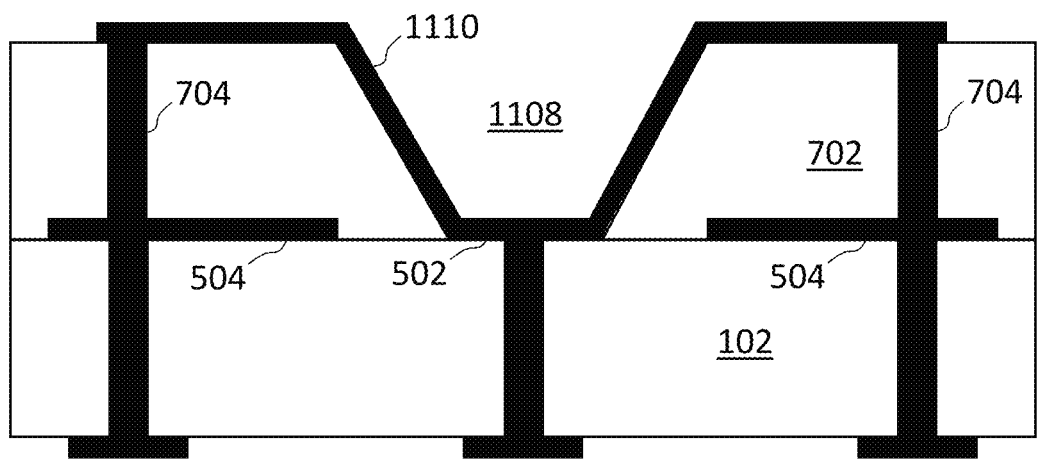

Method 1000 continues with operation 1014 where metal is deposited on the surfaces of the recess. FIG. 11E illustrates metal 1110 being deposited over the surfaces of recess 1108 and over a top surface of one or more dielectric layers 702. Metal 1110 may be the same material as first metal pattern 502 and second metal pattern 504. Metal 1110 may be copper, gold, aluminum, or any alloy thereof. In some embodiments, metal 1110 is deposited by a PVD process, such as sputtering. In some embodiments, metal 1110 is depositing using a CVD process. In still other embodiments, metal 1110 includes a seed layer deposited first using a PVD or CVD process, followed by electroplating further metal on the seed layer. In some embodiments, the seed layer is deposited using an electroless deposition process.

Metal 1110 may be deposited along a top surface of one or more dielectric layers 702 such that metal 1110 forms a top planar region that makes conductive contact with one or more vias 704. In some embodiments, the remainder of recess 1108 over metal 1110 is filled with any of the dielectric materials discussed previously for one or more dielectric layers 702. According to an embodiment, the deposition of metal 1110 completes the 3-D antenna structure with one contact being made via the bottom of recess 1108 at first metal pattern 502. Additionally, the planar top edge of metal 1110 is shunted to a ground plane (second metal pattern 504) using one or more vias 704.

Example Communication Device

Figure 12:
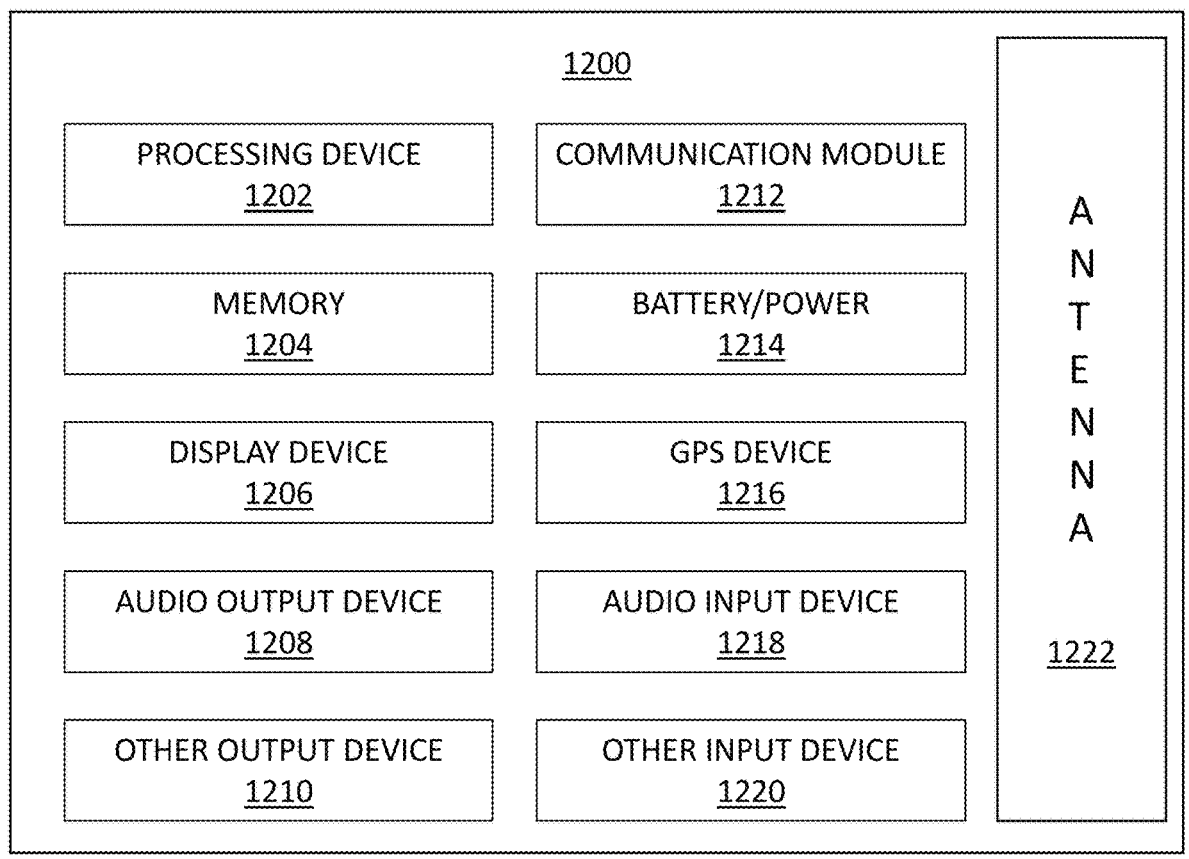
FIG. 12 illustrates a block diagram of an example communication device that may include an antenna board with a 3D antenna, in accordance with an embodiment of the present disclosure.

FIG. 12 is a block diagram of an example communication device 1200 that may include one or more 3D antennas, in accordance with any of the embodiments disclosed herein. Any suitable ones of the components of communication device 1200 may be integrated onto an IC that is flip-chip bonded to an antenna board having one or more 3D antennas, in accordance with any of the embodiments disclosed herein. A number of components are illustrated in FIG. 12 as included in the communication device 1200, but any one or more of these components may be omitted or duplicated, as suitable for the application. In some embodiments, some or all of the components included in the communication device 1200 may be attached to one or more motherboards. In some embodiments, some or all of these components are fabricated onto a single system-on-a-chip (SoC) die.

Additionally, in various embodiments, communication device 1200 may not include one or more of the components illustrated in FIG. 12, but communication device 1200 may include interface circuitry for coupling to the one or more components. For example, communication device 1200 may not include a display device 1206, but may include display device interface circuitry (e.g., a connector and driver circuitry) to which display device 1206 may be coupled. In another set of examples, communication device 1200 may not include an audio input device 1218 or an audio output device 1208, but may include audio input or output device interface circuitry (e.g., connectors and supporting circuitry) to which audio input device 1218 or audio output device 1208 may be coupled.

Communication device 1200 may include a processing device 1202 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 1202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. Communication device 1200 may include a memory 1204, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 1204 may include memory that shares a die with processing device 1202. This memory may be used as cache memory and may include embedded dynamic random access memory (eDRAM) or spin transfer torque magnetic random access memory (STT-MRAM).

In some embodiments, communication device 1200 may include a communication module 1212 (e.g., one or more communication modules). For example, communication module 1212 may be configured for managing wireless communications for the transfer of data to and from communication device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. Communication module 1212 may be, or may include, any of RFIC chip packages 104 or antenna blocks 312 disclosed herein.

Communication module 1212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication module 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication module 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication module 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication module 1212 may operate in accordance with other wireless protocols in other embodiments. Communication device 1200 may include an antenna 1222 to facilitate wireless communications and/or to receive other wireless communications (such as AM or FM radio transmissions). Antenna 1222 may include any number of 3D antennas according to any of the embodiments described herein.

In some embodiments, communication module 1212 may manage wired communications, such as electrical, optical, or any other suitable communication protocols (e.g., the Ethernet). As noted above, communication module 1212 may include multiple communication modules. For instance, a first communication module may be dedicated to shorter-range wireless communications such as Wi-Fi or Bluetooth, and a second communication module may be dedicated to longer-range wireless communications such as global positioning system (GPS), EDGE, GPRS, CDMA, WiMAX, LTE, EV-DO, or others. In some embodiments, the first communication module may be dedicated to wireless communications, and the second communication module may be dedicated to wired communications. In some embodiments, communication module 1212 may include one or more 3D antennas that supports millimeter wave communication.

Communication device 1200 may include battery/power circuitry 1214. Battery/power circuitry 1214 may include one or more energy storage devices (e.g., batteries or capacitors) and/or circuitry for coupling components of communication device 1200 to an energy source separate from communication device 1200 (e.g., AC line power).

Communication device 1200 may include a display device 1206 (or corresponding interface circuitry, as discussed above). Display device 1206 may include any visual indicators, such as a heads-up display, a computer monitor, a projector, a touchscreen display, a liquid crystal display (LCD), a light-emitting diode display, or a flat panel display.

Communication device 1200 may include an audio output device 1208 (or corresponding interface circuitry, as discussed above). Audio output device 1208 may include any device that generates an audible indicator, such as speakers, headsets, or earbuds.

Communication device 1200 may include audio input device 1218 (or corresponding interface circuitry, as discussed above). Audio input device 1218 may include any device that generates a signal representative of a sound, such as microphones, microphone arrays, or digital instruments (e.g., instruments having a musical instrument digital interface (MIDI) output).

Communication device 1200 may include a GPS device 1216 (or corresponding interface circuitry, as discussed above). GPS device 1216 may be in communication with a satellite-based system and may receive a location of communication device 1200, as known in the art.

Communication device 1200 may include an other output device 1210 (or corresponding interface circuitry, as discussed above). Examples of other output device 1210 may include an audio codec, a video codec, a printer, a wired or wireless transmitter for providing information to other devices, or an additional storage device.

Communication device 1200 may include an other input device 1220 (or corresponding interface circuitry, as discussed above). Examples of other input device 1220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Communication device 1200 may have any desired form factor, such as a handheld or mobile communication device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop communication device, a server or other networked computing component, a printer, a scanner, a monitor, a set-top box, an entertainment control unit, a vehicle control unit, a digital camera, a digital video recorder, or a wearable communication device. In some embodiments, the communication device 1200 may be any other electronic device that processes data.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is an RF chip package. The RF chip package includes a housing comprising a first substrate, a 3D antenna on the first substrate, and a second substrate comprising a plurality of semiconductor devices. The first substrate is bonded to the second substrate. The RF chip package also includes one or more conductive contacts configured to electrically connect the RF chip package to other conductive contacts.

Example 2 includes the subject matter of Example 1, wherein the 3D antenna is a monocone antenna.

Example 3 includes the subject matter of Example 2, wherein the monocone antenna comprises a first portion having a sloped surface, and a second portion having a planar surface substantially parallel to a surface of the first substrate.

Example 4 includes the subject matter of Example 3, wherein the sloped surface comprises a cone shape.

Example 5 includes the subject matter of Example 3, wherein the second portion of the monocone antenna is on a top surface of the first substrate, and the first portion of the monocone antenna extends into the first substrate away from the top surface of the first substrate.

Example 6 includes the subject matter of Example 3, wherein the first substrate further comprises a via extending through a thickness of the first substrate and coupled to the first portion of the monocone antenna.

Example 7 includes the subject matter of Example 3, wherein the monocone antenna comprises one or more shorting pins coupled to the second portion of the monocone antenna.

Example 8 includes the subject matter of Example 7, wherein the one or more shorting pins and the first portion of the monocone antenna extend away from the first substrate.

Example 9 includes the subject matter of any one of Examples 1-8, wherein the first substrate is flip-chip bonded to the second substrate.

Example 10 includes the subject matter of any one of Examples 1-9, wherein the first substrate or the second substrate includes an array of solder balls for bonding the first substrate to the second substrate.

Example 11 is a method of fabricating a 3D antenna. The method includes forming a first metal pattern in a first plane over a substrate; forming a second metal pattern in the same plane as the first metal pattern or in a plane closer to a surface of the substrate than the first plane, the second metal pattern being formed around the first metal pattern; depositing one or more dielectric layers over the first metal pattern and the second metal pattern; drilling a cone shape through the one or more dielectric layers, such that a tip of the cone shape is substantially aligned with the first metal pattern; and depositing a metal on the surfaces of the drilled cone shape and on a surface of the one or more dielectric layers, such that the metal conductively contacts the first metal pattern.

Example 12 includes the subject matter of Example 11, wherein the second metal pattern surrounds the first metal pattern.

Example 13 includes the subject matter of Example 11 or 12, further comprising, forming conductive vias through the one or more dielectric layers.

Example 14 includes the subject matter of Example 13, wherein the conductive vias form a conductive pathway between the second metal pattern and the metal on the surface of the one or more dielectric layers.

Example 15 includes the subject matter of any one of Examples 11-14, wherein depositing metal comprises sputtering metal on the surfaces of the drilled cone shape and on the surface of the one or more dielectric layers.

Example 16 includes the subject matter of any one of Examples 11-15, further comprising forming a via through a thickness of the substrate, wherein the via is conductively coupled to the first metal pattern.

Example 17 is a method of fabricating a 3D antenna. The method includes forming a first metal pattern in a first plane over a substrate; forming a second metal pattern in the same plane as the first metal pattern or in a plane closer to a surface of the substrate than the first plane, the second metal pattern being formed around the first metal pattern; depositing one or more dielectric layers over the first metal pattern and the second metal pattern; forming a recess in the one or more dielectric layers such that at least a portion of the first metal pattern is exposed; filling a portion of the recess with a non-conductive material; pressing a cone shape into the non-conductive material, such that a tip of the cone shape is substantially aligned with the first metal pattern; hardening the non-conductive material; and depositing a metal on the surfaces of the hardened non-conductive material and on a surface of the one or more dielectric layers, such that the metal conductively contacts the first metal pattern.

Example 18 includes the subject matter of Example 17, wherein the second metal pattern surrounds the first metal pattern.

Example 19 includes the subject matter of Example 17 or 18, further comprising, forming conductive vias through the one or more dielectric layers.

Example 20 includes the subject matter of Example 19, wherein the conductive vias form a conductive pathway between the second metal pattern and the metal on the surface of the one or more dielectric layers.

Example 21 includes the subject matter of any one of Examples 17-20, wherein the filling comprises filling the portion of the recess with epoxy.

Example 22 includes the subject matter of any one of Examples 17-21, further comprising forming a via through a thickness of the substrate, wherein the via is conductively coupled to the first metal pattern.

Example 23 is a method of fabricating a 3D antenna. The method includes forming a first metal pattern in a first plane over a substrate; forming a second metal pattern in the same plane as the first metal pattern or in a plane closer to a surface of the substrate than the first plane, the second metal pattern being formed around the first metal pattern; disposing a release layer over at least a portion of the first metal pattern; depositing one or more dielectric layers over the first metal pattern and the second metal pattern; removing a portion of the one or more dielectric layers by cutting through the one or more dielectric layers and removing the release layer, the removed portion forming a recess in the one or more dielectric layers; depositing a metal on the surfaces of the recess and on a surface of the one or more dielectric layers, such that the metal conductively contacts the first metal pattern.

Example 24 includes the subject matter of Example 23, wherein the second metal pattern surrounds the first metal pattern.

Example 25 includes the subject matter of Example 23 or 24, further comprising, forming conductive vias through the one or more dielectric layers.

Example 26 includes the subject matter of Example 25, wherein the conductive vias form a conductive pathway between the second metal pattern and the metal on the surface of the one or more dielectric layers.

Example 27 includes the subject matter of any one of Examples 23-26, further comprising forming a via through a thickness of the substrate, wherein the via is conductively coupled to the first metal pattern.

Example 28 includes the subject matter of any one of Examples 23-27, wherein the removing comprises removing the portion of the one or more dielectric layers by cutting with a laser.

Example 29 includes the subject matter of any one of Examples 23-28, wherein depositing the metal comprises: depositing a seed layer of metal; and electroplating additional metal on the seed layer of metal.

What is claimed is:

1. A package, comprising:
a housing, comprising a first substrate, an antenna on the first substrate, and a second substrate having a plurality of semiconductor devices thereon, wherein the first substrate is electrically connected to the second substrate by a plurality of interconnects, the plurality of interconnects vertically between the first substrate and the second substrate, and wherein the plurality of semiconductor devices and the first substrate are in a same horizontal plane;
a plurality of conductive contacts configured to electrically connect the package to other conductive contacts; and
a plurality of vias extending through the second substrate, wherein ones of the plurality of vias couple corresponding ones of the plurality of interconnect to corresponding ones of the plurality of conductive contacts.

2. The package of claim 1, wherein the antenna is a monocone antenna.

3. The package of claim 2, wherein the monocone antenna comprises a first portion having a sloped surface, and a second portion having a planar surface substantially parallel to a surface of the first substrate.

4. The package of claim 3, wherein the sloped surface comprises a cone shape.

5. The package of claim 3, wherein the second portion of the monocone antenna is on a top surface of the first substrate, and the first portion of the monocone antenna extends into the first substrate away from the top surface of the first substrate.

6. The package of claim 3, wherein the first substrate further comprises a via extending through a thickness of the first substrate and coupled to the first portion of the monocone antenna.

7. The package of claim 3, wherein the monocone antenna comprises one or more shorting pins coupled to the second portion of the monocone antenna.

8. The package of claim 7, wherein the one or more shorting pins and the first portion of the monocone antenna extend away from the first substrate.

9. The package of claim 1, wherein the first substrate is flip-chip bonded to the second substrate.

10. The package of claim 1, wherein the first substrate or the second substrate includes an array of solder balls for bonding the first substrate to the second substrate.

\* \* \* \* \*